United States Patent [19]

Schramm

[11] Patent Number: 4,847,570
[45] Date of Patent: Jul. 11, 1989

[54] ELECTRONIC, CONTACTLESS SWITCHGEAR

[75] Inventor: Peter Schramm, Meckenbeuren, Fed. Rep. of Germany

[73] Assignee: Ifm Electronic GmbH, Fed. Rep. of Germany

[21] Appl. No.: 114,935

[22] Filed: Oct. 30, 1987

[30] Foreign Application Priority Data

Oct. 30, 1986 [DE] Fed. Rep. of Germany ....... 3637028
Nov. 11, 1986 [DE] Fed. Rep. of Germany ....... 3638409

[51] Int. Cl.$^4$ ............................................ H03B 5/00
[52] U.S. Cl. .................................. 331/65; 331/117 R
[58] Field of Search ............. 331/65, 117 R; 324/207, 324/236, 327; 340/686

[56] References Cited

U.S. PATENT DOCUMENTS 4,638,262 1/1987 Miyamoto ............................. 331/65

Primary Examiner—David Mis
Attorney, Agent, or Firm—Browdy and Neimark

[57] ABSTRACT

An externally modulated oscillator (10), a switch amplifier connected to the output side of the oscillator (10) and an electronic switch, for instance a transistor, thyristor or triac, controllable by the oscillator (10) via the switch amplifier is shown and described, the oscillator (10) having a oscillator amplifier (15) and a feedback (16). The invention is capable of detecting ferromagnetic modulating elements through paramagnetic material, in that a second feedback (17) is provided, the second feedback (17) has two externally modulatable coils (18, 19) connected in series in opposite directions, the series circuit of the two coils (18, 19) is located in the output circuit of the oscillator amplifier (15) and the junction point of the two coils (18, 19) is connected to the input (21) of the oscillator amplifier (15).

22 Claims, 2 Drawing Sheets

ELECTRONIC, CONTACTLESS SWITCHGEAR

BACKGROUND OF THE INVENTION

The invention relates to electronic, contactless switchgear, having an externally modulatable component, preferably an externally modulatable coil, a switch amplifier connected to the output side of the component or coil, and an electronic switch, for instance a transistor, a thyristor or a triac, that is controllable by the component or the coil.

It has been stated above that an externally modulatable component is part of the electronic switchgear in question. The component may be any one of quite various kinds of externally modulatable components. In particular, however, the invention relates to electronic switchgear of the above-described type, in which the externally modulatable component is embodied as a coil, and the coil is part of the circuit of an externally modulatable oscillator having an oscillator amplifier and a feedback.

Electronic switchgear of the latter type mentioned above is embodied in contactless fashion and is now being used more an more, instead of electrical, mechanically actuated switchgear operating with contact, in electronic measuring and open- and closed-loop control circuits; this kind of switchgear is known as proximity switches. With such proximity switches, an indication is provided as to whether a modulating element, to which the corresponding proximity switch is sensitive, has come sufficiently close to the proximity switch. In other words, if a modulating element to which the corresponding proximity switch is sensitive has approached sufficiently close to the oscillator, then the oscillator toggles the electronic switch. In the case of switchgear embodied as a closing element, the initially non-conducting electronic switch now becomes conductive, while in switchgear embodied as an opener the initially conductive electronic switch is now made to block. With switchgear of this type, an indication can also be provided as to whether a physical variable of a modulating medium to which the switchgear is sensitive has attained a corresponding value.

A substantial component of switchgear of the above-described type is the externally modulatable oscillator, which is typically embodied such that it can be inductively modulated; in this case it is an inductive proximity switch.

In conventional inductive proximity switches, the following equations apply for the oscillator, as long as a metal part has not yet attained a predetermined distance from the oscillator:

$$K \cdot V = 1$$

where K=feedback factor and V=amplification factor; that is, the oscillator vibrates. Once the corresponding metal part has attained the predetermined spacing, the increasing damping of the oscillator leads to a reduction of the amplifier factor V, so that K times V becomes less than 1; that is, the oscillator stops vibrating (or the amplitude of the oscillator vibration drops below a predetermined threshold value).

Conventional inductive proximity switches, which respond in such a manner that the electromagnetic alternating field in the metal part that is used as the modulating element induces damping eddy currents in the vibrating oscillator, are still in need of further improvement in the following aspects.

On the one hand, the damping that is present when a metal part has not approached must be as low as possible, so that upon the approach of the metal part toward the inductive proximity switch, damping caused by eddy currents can be evaluated. This means that the conventional inductive proximity switches are not readily as sensitive as would be desired. In particular, the conventional inductive proximity switches must not be surrounded on all sides by metal, and such inductive proximity switches cannot detect ferromagnetic modulating elements through damping paramagnetic material, for instance through aluminum housing walls. On the other hand, the conventional inductive proximity switches respond to modulating elements both of paramagnetic and of ferromagnetic material.

SUMMARY OF THE INVENTION

It is now the object of the invention to disclose electronic, contactless switchgear, that is, an inductive proximity switch, which is particularly sensitive and preferably can detect ferromagnetic modulating elements through paramagnetic material, or preferably responds only to paramagnetic material, that is, does not respond to ferromagnetic material.

The electronic contactless switchgear according to the invention is characterized initially and substantially in that a second externally modulatable coil is provided, the two coils are connected in series in opposite directions, and the junction point of the two coils is connected to the input of the switch amplifier, either directly or indirectly. A substantial factor in the teaching of the invention is that in accordance with the invention two externally modulatable coils are provided, that the two coils are modulated differently, even if only slightly differently, and that because the two coils are connected in series in opposite directions, a differential signal is obtained, which can be particularly well evaluated, so that the electronic, contactless switchgear according to the invention is particularly sensitive and in a special way.

The teaching of the invention is particularly applicable in electronic, contactless switchgear of the type in question, in which the coil is part of the circuit of an externally modulatable oscillator having an oscillator amplifier and a feedback. Then the teaching of the invention comprises providing the series circuit of the two coils as a feedback or - in addition to a feedback realized in another manner - as a second feedback, and disposing it in the outlet circuit of the oscillator amplifier and connecting the junction point of the two coils with the input of the oscillator amplifier. In other words, while in the conventional inductive proximity switches that are a point of departure for the invention, the eddy currents induced by the electromagnetic alternating field in the metal part used as a modulating element cause damping and it is this damping that is evaluated, in the electronic switchgear described above in accordance with the invention, two coils are modulated, in fact modulated to different extents, and it is the difference in the effects of these modulations that is evaluated. The two specific teachings mentioned above are subordinate to this common inventive concept; in the first case, the actual feedback is modulated, and in the second case, in addition to the actual feedback, a second feedback is provided, which is modulated.

The electronic contactless switchgear according to the invention can be sensitive in qualitatively different ways. In a first embodiment the dissimilar modulation of the magnetic circuits of the two coils is evaluated; this embodiment is capable of detecting ferromagnetic modulating elements through paramagnetic material. In a second embodiment, the dissimilar damping of the two coils is evaluated; this embodiment can be designed such that it responds only to modulating elements made of paramagnetic material.

It was noted above that the teaching of the invention includes various embodiments, on the one hand embodiments in which the differential signal of the two coils is evaluated differently from the manner in the context of an oscillator, and on the other hand embodiments in which the differential signal of the two coils is obtained by means of dissimilar damping of the two coils. In the ensuing description, however, the teaching of the invention as well as embodiments and further refinements of the teaching of the invention will be described in further detail referring to an exemplary embodiment shown in the drawing, in which the differential signal of the two coils is evaluated in the context of an oscillator, this differential signal being obtained by modulation of the magnetic circuit of the two coils.

DETAILED DESCRIPTION OF THE PREFERRED EMBODIMENTS

Figure 1:
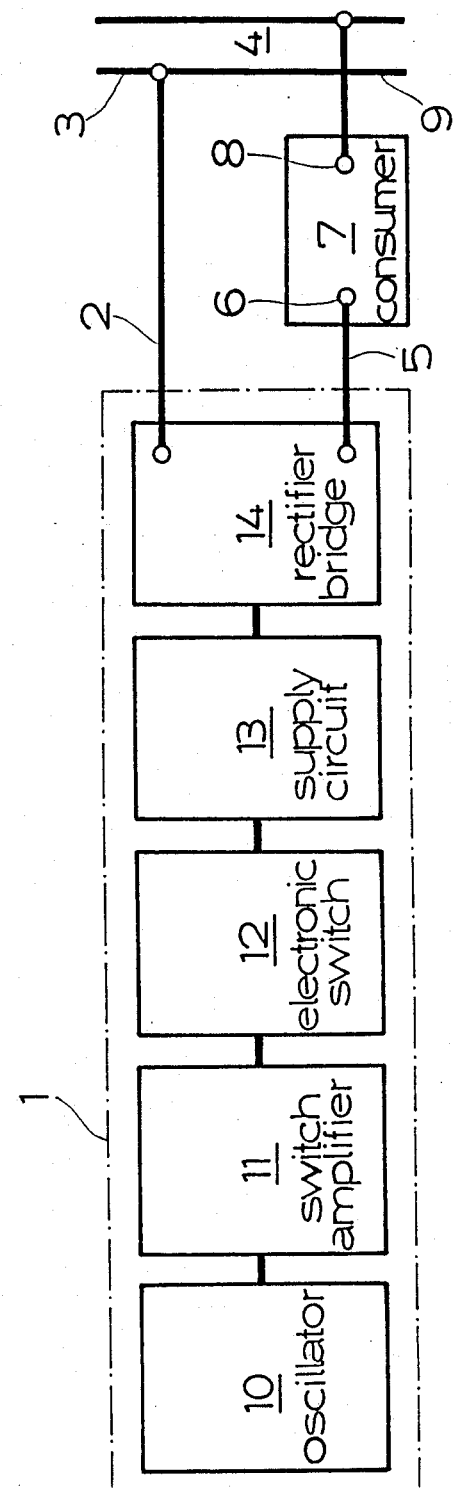
FIG. 1 is a block circuit diagram of electronic, contactless switchgear in accordance with the invention.

The electronic switchgear 1 shown in FIG. 1 with the aid of a block circuit diagram operates in a contactless manner; that is, it responds to an approaching ferromagnetic modulating element, not shown, and is connected via an outer lead 2 to one pole 3 of an operating voltage source 4 and via only one further outer lead 5 to a connection 6 of a consumer 7, while the other connection 8 of the consumer 7 is connected to the other pole 9 of the source of operating voltage 4. In other words, the switchgear 1 shown is connected in a known manner via a total of only two outer leads 2, 5 to the operating voltage source 4, on the one hand, and the consumer 7, on the other.

As FIG. 1 shows, the switchgear 1 shown, in its basic structure, comprises an externally modulatable oscillator 10, a switch amplifier 11 connected to the output side of the oscillator 10, an electronic switch 12, for instance a transistor, a thyristor or a triac, which is controllable by the oscillator 10 via the switch amplifier 11, and a supply circuit 13 representing the supply voltage for the oscillator 10 and the switch amplifier 11. On the input side, a rectifier bridge 14 is also provided, because in the exemplary embodiment the operating voltage source 4 is a source of alternating voltage.

The teaching of the invention does not relate to how the switch amplifier 11 or the supply circuit 13 are embodied, and so details of these elements are not shown in the figures.

Figure 2:
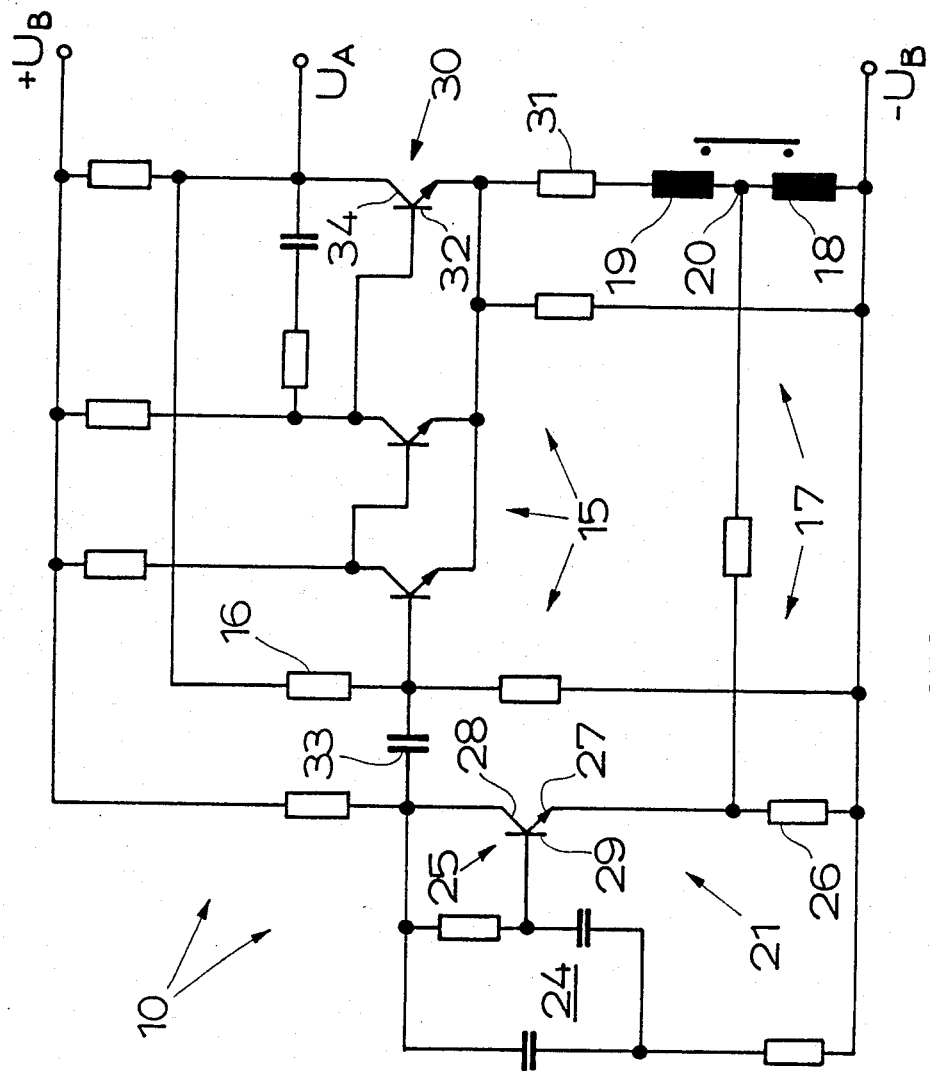
FIG. 2 is a circuit diagram of a preferred embodiment of an oscillator of the electronic, contactless switchgear of FIG. 1.

FIG. 2 now shows that the oscillator 10 first has an oscillator amplifier 15 and a feedback 16, and that a second feedback 17 is provided, and a second feedback 17 has two externally modulatable coils 18, 19 connected in series in opposite directions. The series circuit of the coils 18, 19 is located in the output circuit of the oscillator amplifier 15, and the junction point 20 of the two coils 18, 19 is connected to the input 21 of the oscillator amplifier 15.

Figure 3:
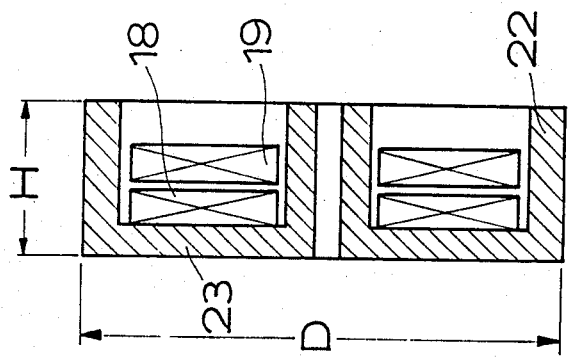
FIG. 3 is a preferred embodiment of the two coils belonging to the oscillator of FIG. 2.

It has been explained above that in the electronic switchgear 1 according to the invention, the magnetic circuits of the two coils 18, 19 are modulated, in fact are modulated to different extents. This is also true even when, as in the exemplary embodiment shown, the two coils 18, 19 are located in a magnetic circuit that is substantially common to both coils 18, 19. In the exemplary embodiment shown, as in FIG. 3, this is accomplished by providing that a common iron core 22 is associated with both coils 18, 19. The iron core 22 is E-shaped in cross-section, namely cup-shaped, and the two coils 18, 19 are disposed one after the other in the modulation direction, that is, in the axial direction of the cup-shaped iron core 22. The distance of the coil 18 from the bottom 23 of the iron core 22, the distance of the coil 19 from the bottom 23 of the iron core 22, the distance between the two coils 18 and 19, the diameter D of the iron core 22 and the height of the iron core 22 are parameters with the aid of which the sensitivity of the electronic switchgear 1 according to the invention can be modulated. Depending upon the individual parameters specified, one of average skill in the art can empirically ascertain the other parameters in order to optimize the sensitivity of the electronic switchgear according to the invention.

In the electronic switchgear according to the invention, it is basically possible to connect the second feedback 17 in the manner of a positive feedback. What is shown in the drawings, however, is an exemplary embodiment in which the second feedback 17 is connected in the manner of a negative feedback.

In order for the oscillator 10 in the electronic switchgear 1 according to the invention to oscillate at a predetermined frequency, which for the sake of the penetration depth is preferably a frequency $f = kHz$, the oscillator amplifier 15 is embodied as frequency-selective, as shown in FIG. 2, namely being provided with an RC element 24 as the frequency-determining circuit portion. As for the rest of the exemplary embodiment of the oscillator 10 of the switchgear 1 according to the invention shown in FIG. 2, the oscillator amplifier 15 has an input transistor 25; an emitter resistor 26 is located in the emitter circuit of the input transistor 25, and the junction point 20 of the coils 18, 19 is connected to the emitter 27 of the input transistor 25; and the RC element 24 is connected to the collector 28 and to the base 29 of the input transistor 25. As FIG. 2 also shows, in the illustrated exemplary embodiment the oscillator amplifier 15 has an output transistor 30, and the series circuit comprising an emitter resistor 31 and the two coils 18, 19 is located in the emitter circuit of the output transistor 30. Finally, FIG. 2 also shows a preferred exemplary embodiment in the sense that a coupling capacitor 33 is provided between the collector 28 of the input transistor 25 and the base 32 of the output transistor 30, and that a feedback resistor is connected, as the feedback 16, between the collector 34 of the output transistor 30 and the end of the coupling capacitor 33 remote from the collector 28 of the input transistor 25.

What is claimed is:

1. An electronic, contactless switchgear, comprising:

a first externally modulatable component having an output;

a switch amplifier connected to said output of said component;

an electronic switch controllable by said component via said switch amplifier;

a second externally modulatable component connected with said first externally modulatable component in series in opposite directions; and a junction point between said first and second externally modulatable components connected with an input of said switch amplifier.

2. The electronic switchgear according to claim 1, wherein said first and second externally modulatable components comprise a first and second externally modulatable coil, respectively, and said switch amplifier as connected to an output of said first coil.

3. The electronic switchgear according to claim 2, wherein said electronic switch is selected from the group consisting of: a transistor, a thyristor and a triac.

4. The electronic switchgear according to claim 3, further comprising an externally modulatable oscillator having a circuit part consisting of said first coil, an oscillator amplifier and a feedback, said feedback consisting of the series circuit of the two coils, and being located in an output circuit of said oscillator amplifier, said junction point of the two coils being connected to an input of the oscillator amplifier.

5. The electronic switchgear according to claim 3, further comprising an externally modulatable oscillator having a circuit part consisting of said first coil, an oscillator amplifier and a first feedback, the first feedback consisting of the series circuit of the two coils located in an output circuit of said oscillator amplifier, said junction point of the two coils being connected to an input of the oscillator amplifier.

6. The electronic switchgear according to claim 3, wherein said two coils are located in a magnetic circuit that is substantially common to both coils.

7. The electronic switchgear according to claim 6, further comprising a common iron core associated with both coils.

8. The electronic switchgear according to claim 7, wherein said iron core has an E-shaped cross section.

9. The electronic switchgear according to claim 8, wherein said iron core is cup-shaped.

10. The electronic switchgear according to claim 3, wherein said two coils are disposed in line with one another in a direction of modulation.

11. The electronic switchgear according to claim 5, wherein said second feedback is connected as a positive feedback.

12. The electronic switchgear according to claim 5, wherein said second feedback is connected as a negative feedback.

13. The electronic switchgear according to claim 4, wherein said oscillator amplifier is frequency-selective.

14. The electronic switchgear according to claim 13, wherein said oscillator amplifier comprises a frequency-determining circuit portion consisting of a RC element.

15. The electronic switchgear according to claim 4, wherein said oscillator amplifier has an input transistor having an emitter, a collector and a base, said oscillator amplifier further comprising an emitter resistor located in an emitter circuit of the input transistor, and wherein the junction point of the two coils is connected to the emitter of the input transistor.

16. The electronic switchgear according to claim 15, wherein said RC element is connected to the collector and to the base of the input transistor.

17. The electronic switchgear according to claim 3, wherein said oscillator amplifier has an output transistor.

18. The electronic switchgear according to claim 17, wherein the series circuit of the two coils comprises an emitter resistor and is disposed in an emitter circuit of the output transistor.

19. The electronic switchgear according to claim 15, further comprising a coupling capacitor provided between the collector of the input transistor and a base of the output transistor.

20. The electronic switchgear according to claim 19, wherein said first feedback comprises a coupling resistor provided between a collector of the output transistor and an end of the coupling capacitor remote from the collector of the input transistor.

21. The electronic switchgear according to claim 18, further comprising a coupling capacitor provided between the collector of the input transistor and a base of the output transistor.

22. The electronic switchgear according to claim 21, wherein said first feedback comprises a coupling resistor provided between a collector of the output transistor and an end of the coupling capacitor remote from the collector of the input transistor.

* * * * *